United States Patent
Abadeer et al.

(10) Patent No.: US 7,466,171 B2
(45) Date of Patent: Dec. 16, 2008

(54) VOLTAGE DETECTION CIRCUIT AND CIRCUIT FOR GENERATING A TRIGGER FLAG SIGNAL

(75) Inventors: Wagdi W. Abadeer, Jericho, VT (US); Jeffrey S. Brown, Middlesex, VT (US); Albert M. Chu, Essex, VT (US); John A. Fifield, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 11/623,119

(22) Filed: Jan. 15, 2007

(65) Prior Publication Data

US 2008/0169844 A1   Jul. 17, 2008

(51) Int. Cl.
*H03L 7/00* (2006.01)
(52) U.S. Cl. .................................. 327/143; 327/198
(58) Field of Classification Search .................. 327/143, 327/198
See application file for complete search history.

(56) References Cited

U.S. PATENT DOCUMENTS

| | | | |
|---|---|---|---|
| 3,571,626 A | 3/1971 | Reif | |
| 3,622,805 A | 11/1971 | McMorrow, Jr. | |
| 3,828,204 A | 8/1974 | Farnsworth | |
| 3,879,669 A | 4/1975 | Moriyasu | |
| 4,063,119 A | 12/1977 | Odell et al. | |
| 4,694,198 A | 9/1987 | Umeki | |
| 5,116,342 A | 5/1992 | Schmidt et al. | |
| 5,144,159 A * | 9/1992 | Frisch et al. | 327/198 |
| 5,336,942 A | 8/1994 | Khayat | |
| 5,365,121 A | 11/1994 | Morton et al. | |
| 5,703,807 A * | 12/1997 | Smayling et al. | 365/185.03 |
| 6,285,222 B1 * | 9/2001 | Kitade | 327/143 |
| 6,335,649 B1 | 1/2002 | Maeda | |
| 6,577,480 B1 | 6/2003 | Avery et al. | |
| 6,801,060 B2 | 10/2004 | Ikehashi et al. | |
| 7,030,668 B1 * | 4/2006 | Edwards | 327/143 |
| 7,049,865 B2 * | 5/2006 | Parker et al. | 327/143 |
| 7,187,219 B2 * | 3/2007 | Olsen | 327/143 |

* cited by examiner

*Primary Examiner*—Kenneth B. Wells
(74) *Attorney, Agent, or Firm*—Downs Rachlin Martin PLLC

(57) ABSTRACT

An integrated circuit that includes at least one tunneling device voltage detection circuit for generating a trigger flag signal. The tunneling device voltage detection circuit includes first and second voltage dividers receiving a supply voltage and having corresponding respective first and second internal node output voltages. The first and second voltage dividers are configured so the first output voltage is linear relative to the supply voltage and so that the second output voltage is nonlinear relative to the supply voltage. As the supply voltage ramps up, the profiles of the first and second output voltage cross at a particular voltage. An operational amplifier circuit senses when the first and second output voltages become equal and, in response thereto, outputs a trigger signal that indicates that the supply voltage has reached a certain level.

20 Claims, 5 Drawing Sheets

US 7,466,171 B2

VOLTAGE DETECTION CIRCUIT AND CIRCUIT FOR GENERATING A TRIGGER FLAG SIGNAL

FIELD OF THE DISCLOSURE

The present disclosure generally relates to the field of voltage detection circuits in integrated circuits. In particular, the present disclosure is directed to a voltage detection circuit in an integrated circuit and method of generating a trigger flag signal.

BACKGROUND

In an integrated circuit, analog, digital, or mixed-signal circuits have a range of power supply voltage within which they operate predictably and reliably. Consequently, integrated circuits typically include a power supply voltage detection circuit for monitoring the power supply during its power up sequence. More specifically, during the power up sequence of an integrated circuit, the power supply voltage may take hundreds of milliseconds to reach its desired value. Additionally, the power supply voltage may ramp up in a non-monotonic fashion, i.e., the power supply voltage may wobble up and down slightly as it is ramping up, until it reaches a stable desired voltage level. This is because during the power up sequence various circuits activate in sequence and may cause the demands on the power supply to vary in a nonlinear fashion. Consequently, the voltage detection circuit is utilized to detect when the power supply voltage has reached a certain minimum value and to generate an electronic indicator (e.g., a trigger flag) to the one or more circuits of interest, which is an indicator that a safe minimum operating voltage is reached.

Traditional power supply voltage detection circuits often trigger off of multiples of the voltage threshold (Vt) of a device, such as the Vt of a field-effect transistor (FET) device. In this scenario, when the power supply voltage reaches a value of, for example, Vt×1 or Vt×2, a trigger flag is generated. However, the Vt of devices changes with process, voltage, and temperature variations and, thus, using a multiple of Vt is not a stable way to establish a voltage detection circuit. More specifically, because the Vt value may vary +/−300-450 mV with process, voltage, and temperature, the trigger voltage that results from of a stack of transistors, which is used to generate multiples of Vt, may vary over several hundred millivolts (mV).

For at least these reasons, a need exists for a voltage detection circuit in an integrated circuit and method of generating a trigger flag signal, in order to provide a voltage detection circuit that has a more predictable and stable trigger flag signal as compared with traditional Vt-based voltage detection circuits.

SUMMARY OF THE DISCLOSURE

In one embodiment, the present disclosure is directed to a power supply network for supplying a supply voltage to functional circuitry and a trigger circuit that includes a first voltage divider stack comprising a first input in electrical communication with the power supply network, and a first internal node for providing a first divided output voltage. The trigger circuit also includes a second voltage divider stack electrically coupled to the power supply network in parallel with the first voltage divider stack and having a nonlinear relationship to the supply voltage. The second voltage divider stack comprises a second input in electrical communication with the power supply network, and a second internal node for providing a second divided output voltage. Output circuitry is in electrical communication with the first internal node and the second internal node and is operatively configured to generate a digital trigger flag as a function of the first divided output voltage and the second divided output voltage.

In another embodiment, the present disclosure is directed to an integrated circuit. The integrated circuit comprises a power supply network for supplying a supply voltage to functional circuitry. The integrated circuit also comprises a trigger circuit that includes a first voltage divider stack comprising a first input in electrical communication with the power supply network, and a first internal node for providing a first divided output voltage. The trigger circuit also includes a second voltage divider stack electrically coupled to the power supply network in parallel with the first voltage divider stack. The second voltage divider comprises a first leaky capacitor that includes a second input in electrical communication with the power supply network, and a second leaky capacitor electrically connected in series with one another so as to define a second internal node for providing a second divided output voltage. Output circuitry is in electrical communication with the first internal node and the second internal node and is operatively configured to generate a digital trigger flag as a function of the first divided output voltage and the second divided output voltage.

In yet another embodiment, the present disclosure is directed to another integrated circuit. This integrated circuit comprises a voltage trigger circuit that includes a first voltage divider stack for providing a first divided voltage. The first voltage divider stack comprises a first field effect transistor having a first gate oxide layer, and a second field effect transistor having a second gate oxide layer. The first field effect transistor and the second field effect transistor are electrically coupled in series so as to define a first internal node and provide a first current path that includes current tunneling through the first gate oxide layer and the second gate oxide layer. The voltage trigger circuit also includes a second voltage divider stack for providing a second divided voltage. The second voltage divider is electrically connected in parallel to the first voltage divider. The second voltage divider stack comprises a third field effect transistor having a third gate oxide layer, and a fourth field effect transistor having a fourth gate oxide layer. The third field effect transistor and the fourth field effect transistor are electrically coupled in series so as to define a second internal node and provide a second current path that includes current tunneling through the third gate oxide layer and the fourth gate oxide layer.

In a further embodiment, the present disclosure is directed to a method of generating a trigger flag signal. The method comprises dividing a supply voltage so as to provide a first divided voltage output having a first profile of the first divided output voltage versus the supply voltage. The supply voltage is divided so as to provide a second divided voltage having a second profile of the second divided voltage versus the supply voltage that crosses the first profile at a single crossover voltage. Issuance of a digital trigger flag is initiated when the second divided voltage is substantially equal to the first divided voltage.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
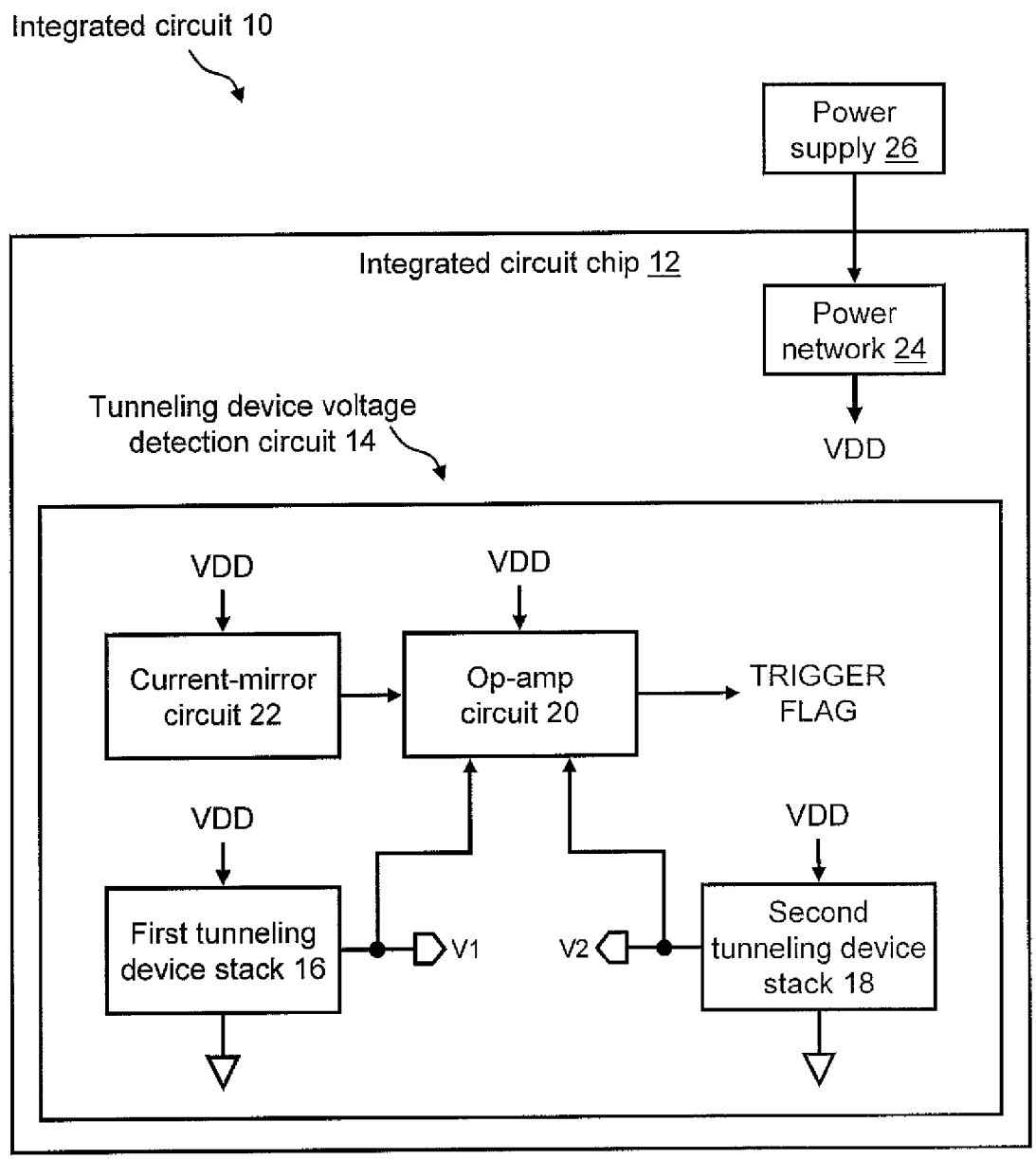
FIG. 1 illustrates a functional block diagram of an integrated circuit that includes a tunneling device voltage detection circuit for generating a predictable and stable trigger flag signal.

Referring now to the drawings, FIG. 1 illustrates an integrated circuit 10 of the present invention that may be fabricated upon an integrated circuit chip 12 and that includes at least one tunneling device (TD) voltage detection circuit 14 made in accordance with the present disclosure. As described below in more detail, TD voltage detection circuit 14 generally includes a first device stack 16 that includes a first output voltage node V1 having a first voltage that varies linearly with a power supply voltage (here, voltage VDD) and a second device stack 18 that includes a second output voltage node V2 having a second voltage (also designated "V2" for convenience) that varies non-linearly with voltage VDD. (For convenience, certain voltage nodes and the voltages on those nodes are designated by the same descriptors, e.g., voltage node V1 has first voltage V1, voltage node V2 has second voltage V2, etc.) TD voltage detection circuit 14 may be electrically connected to one or more logic circuits, analog circuits, and/or mixed-signal circuits (not shown) within integrated circuit 10 as needed in a particular design. Those skilled in the art will readily appreciate the variety of circuits that may be used with TD voltage detection circuit 14. TD voltage detection circuit 14 may also include a differential operational amplifier (op-amp) circuit 20 and a current-mirror circuit 22, and integrated circuit 10 may further include a power network 24, which may be the power distribution network for supplying an operating voltage (e.g., voltage VDD or any multiple thereof) to, among other circuits, tunneling device voltage detection circuit 14. Integrated circuit 10 may be powered by, for example, a power supply 26 that feeds the input of power network 24 within integrated circuit chip 12. Power supply 26 may be, for example, an external direct current (DC) power supply. Example non-zero steady-state supply voltage VDD values may include, but are not limited to, 1.0, 1.2, and 3.3 volts.

As described below in more detail, TD voltage detection circuit 14 generally operates as follows. When power supply 26 is first started, supply voltage VDD is initially zero volts and then increases to a predetermined non-zero steady-state value. First and second device stacks 16, 18, which output a linear first voltage V1 and a non-linear second voltage V2, respectively, are designed so that at a first particular non-zero value of supply voltage VDD, the rising voltage profiles of first and second voltages cross one another at a second particular non-zero value. When op-amp circuit 20 detects this second particular non-zero value (by detecting when first and second voltages V1, V2 become equal, the op-amp circuit may output a trigger flag TRIGGER FLAG to the appropriate circuitry (not shown) that indicates that VDD has reached a suitable level to sustain operability of integrated circuit 10. A designer may select the first and second particular non-zero values of supply voltage VDD and first and second voltages V1, V2, respectively, needed for a particular application, and design the components of TD voltage detection circuit 14 accordingly.

Figure 2:
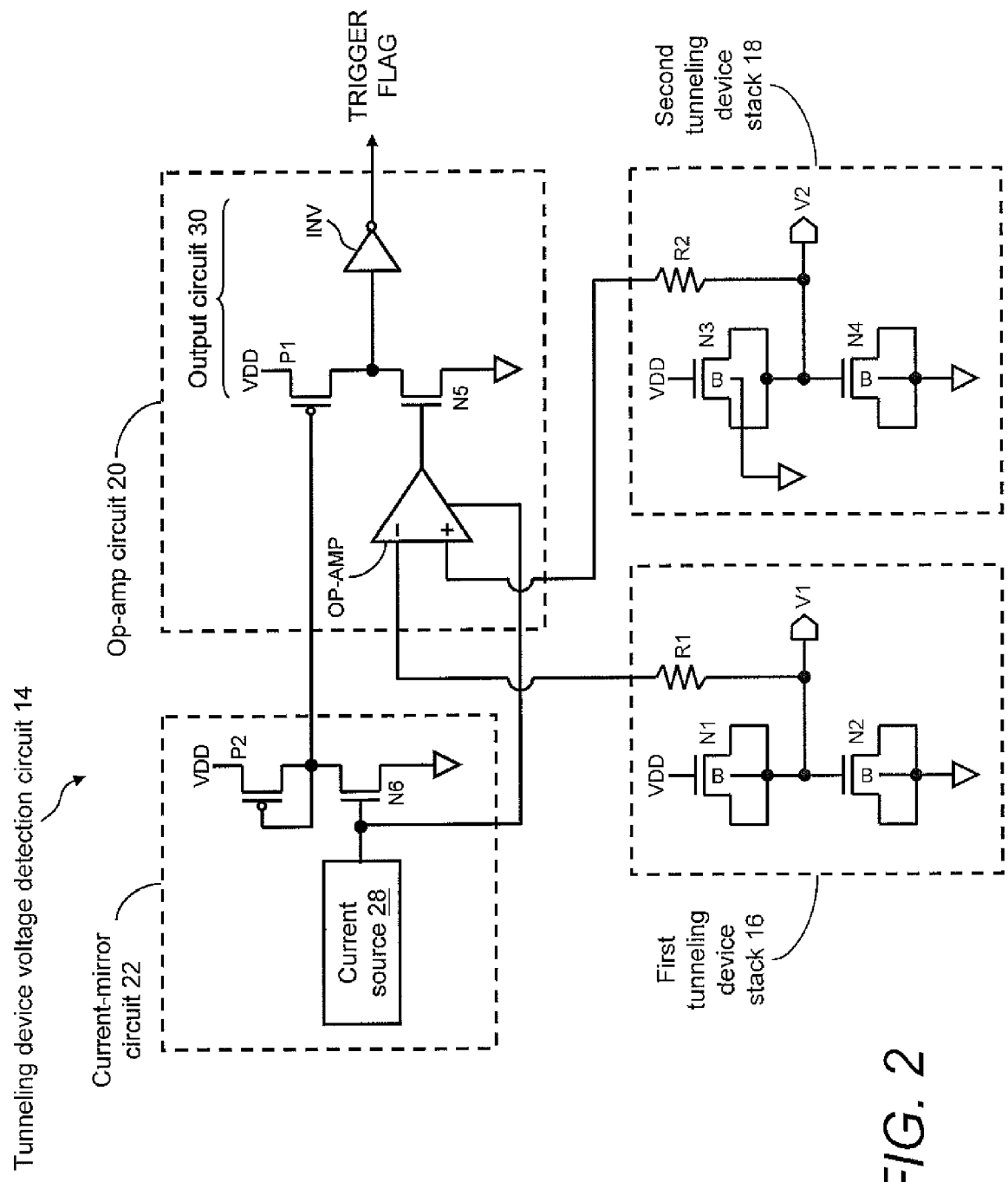
FIG. 2 illustrates a schematic diagram of the tunneling device voltage detection circuit of FIG. 1.

FIG. 2 illustrates a particular embodiment of TD voltage detection circuit 14 of FIG. 1 for generating a predictable and stable trigger flag signal TRIGGER FLAG. In this embodiment, first device stack 16 may include a stack of two similar transistors biased in a current tunneling mode in order to form a first voltage divider circuit. In one example, first device stack 16 includes n-type transistors N1, N2 electrically connected in series between VDD and ground so as to be biased in a current tunneling mode. In this example, first voltage V1 on intermediate voltage node V1 is substantially equal to one-half of supply voltage VDD. The bulk node B of transistor N1 is electrically connected to first voltage node V1, and the bulk node B of transistor N2 is electrically connected to ground. In alternative embodiments, first device stack 16 may be formed of a resistor divider network. In addition, it is noted that first voltage V1 is not limited to a one-half of supply voltage VDD; rather, the devices that form the first device stack may be sized such that first voltage V1 equals any division of supply voltage VDD.

In this example, transistors N1, N2 have substantially equal oxide thickness, substantially equal voltage thresholds (Vt), and substantially equal oxide areas. The range of oxide thickness is such that a tunneling current can flow through each of transistors N1, N2. This range may be about 4.0 nm down to about 0.8 nm. In one example, the oxide thickness of each transistor N1, N2 is 1.40 nm. The range of Vt may be about 100 mV to about 400 mV, which may be considered a typical or normal-Vt range for such devices. In one example, the normal-Vt of each transistor N1, N2 may be 0.347 V. The oxide area may be expressed in terms of channel width (W) and length (L), measured in microns. The only requirement on the oxide area of transistors N1, N2 is that each is at least 1.0 square micron with dimensions of at least 1.0 micron×1.0 micron. This condition is to allow the Vt of transistors N1, N2 to be independent of the variations in the W/L ratio. In one example, the W/L ratio of each transistor N1, N2 may be 50.0/10.0 microns. Because the oxide area of transistors N1, N2 are equal, the voltage across transistor N1 is equal to the voltage across transistor N2 and, thus, first voltage V1 is substantially equal to one-half of supply voltage VDD. Consequently, first voltage V1 has a linear relationship to VDD.

Second device stack 18 may include a stack of two dissimilar nFETs N3, N4 electrically connected in series between VDD and ground and biased in a current tunneling mode in order to form a second voltage divider circuit. Intermediate voltage node V2 is located between transistors N3 and N4. The bulk nodes B of corresponding respective transistors N3, N4 may be electrically connected ground. In one embodiment, transistors N3, N4 have substantially equal oxide thicknesses, but have unequal oxide areas and unequal Vts. Like transistors N1, N2 of first device stack 16, the oxide thickness range for transistors N3, N4 may be, e.g., about 4.0 nm down to about 0.8 nm. In one example, the oxide thickness of each transistor N3, N4 is 1.4 nm.

In the present example and like transistors N1, N2, transistor N3 may be considered a normal-Vt device. However, transistor N4 may be considered a low-Vt or an ultra-low-Vt device as compared with each of transistors N1, N2, N3. A low-Vt range may be considered to be about 0.0 mV to about 200 mV. In one example, the low-Vt of transistor N4 may be 0.128 V. An ultra-low-Vt range may be considered to be about −200 mV to about 100 mV. In one example, the ultra-low-Vt of transistor N4 may be 0.026 V. Alternatively, transistor N4 may be considered a high-Vt device as compared with transistor N3. A high-Vt range may be about 300 mV to about 600 mV. In one example, the high-Vt of transistor N4 may be 0.573 V. Because transistors N1, N2, N3, N4 have Vts only a fraction of 1.0V, when power supply voltage VDD is 1.0 volt or less, there is sufficient voltage margin within TD voltage reference circuit 14 to allow device operation.

Like transistors N1, N2, the only requirement on the oxide areas of transistors N3, N4 is that each is at least 1.0 square micron with dimensions of at least 1.0×1.0 micron. In one example, the W/L of transistor N3 may be 130.0/10.0 microns and the W/L ratio of transistor N4 may be 200.0/2.0 microns. Because the Vt of transistors N3, N4 are unequal, the gate tunneling current characteristics of transistors N3, N4 are different and, thus, the voltage across transistor N3 is not equal to the voltage across transistor N4. Consequently, second voltage V2 has a nonlinear relationship to supply voltage VDD and, thus, second voltage V2 is not simply equal to one-half of supply voltage VDD.

Op-amp circuit 20 may be a differential operational amplifier circuit for sensing a difference between two voltages and outputting a signal as a function of this difference. Op-amp circuit 20 may include a standard, high gain, operational amplifier OP-AMP whose negative input is fed by first voltage V1 of first device stack 16 via isolation resistor R1 and whose positive input is fed by second voltage V2 of second device stack 18 via isolation resistor R2. Op-amp circuit 20 may also include an output circuit 30 that includes the output of OP-AMP and feeds an n-type/p-type pair of transistors N5, P1 whose intermediate node is electrically connected to an inverter/buffer (INV), whose output, in turn, is a digital trigger signal TRIGGER FLAG. Transistor P1, which may be controlled by an output of current-mirror circuit 22, which provides a constant current source for transistor P1. The output of operational amplifier OP-AMP is a voltage level that is equal to second voltage V2 minus first voltage V1 and, thus, transistor N5, which is controlled by the operational amplifier, turns on when the second voltage V2 is greater than the first voltage V1. Inverter/buffer INV serves to translate the voltage on the node intermediate to transistors N5, P1 to a clean digital signal, i.e., trigger signal TRIGGER FLAG, that may feed standard analog, digital, or mix-signal circuitry (not shown). More specifically, during the power up sequence, trigger signal TRIGGER FLAG is initially a logic zero and as supply voltage VDD ramps up, trigger signal TRIGGER FLAG transitions from a zero to a one at the instant that second voltage V2 is substantially equal to or greater than first voltage V1.

Current-mirror circuit 22 may include a current source 28 that feeds, e.g., an n-type/p-type pair of transistors N6, P2. The output of transistor P2 is a regulated voltage level that may be used to regulate the current through a similar pFET device, such as transistor P1. Similarly, the output of current source 28 is a regulated level that may be used to regulate the current through nFET devices, such as transistor N6. Additionally, current source 28 may provide a current mirror reference supply for operational amplifier OP-AMP.

The trigger point for op-amp circuit 20 issuing trigger signal TRIGGER FLAG may vary as a function of the N3/N4 device ratio, i.e., the ratio of the respective oxide areas of transistors N3, N4. Therefore, with the oxide area of transistor N3 held constant, the trigger point for trigger signal TRIGGER FLAG may be varied by adjusting the oxide area of transistor N4, thereby, changing the N3/N4 device ratio. For example, for a trigger point where supply voltage VDD is 1 volt, the N3/N4 device ratio is set such that the crossover point of the profiles of first and second voltages V1, V2 is the desired trigger point voltage divided by two, which in this example is 1 volt divided by two, i.e., 0.5 volts. Example N3/N4 device ratios and resulting crossover points of the profiles of first and second voltages V1, V2 are described below in connection with FIG. 3, and one example trigger point is described below relative to FIG. 5.

Figure 3:
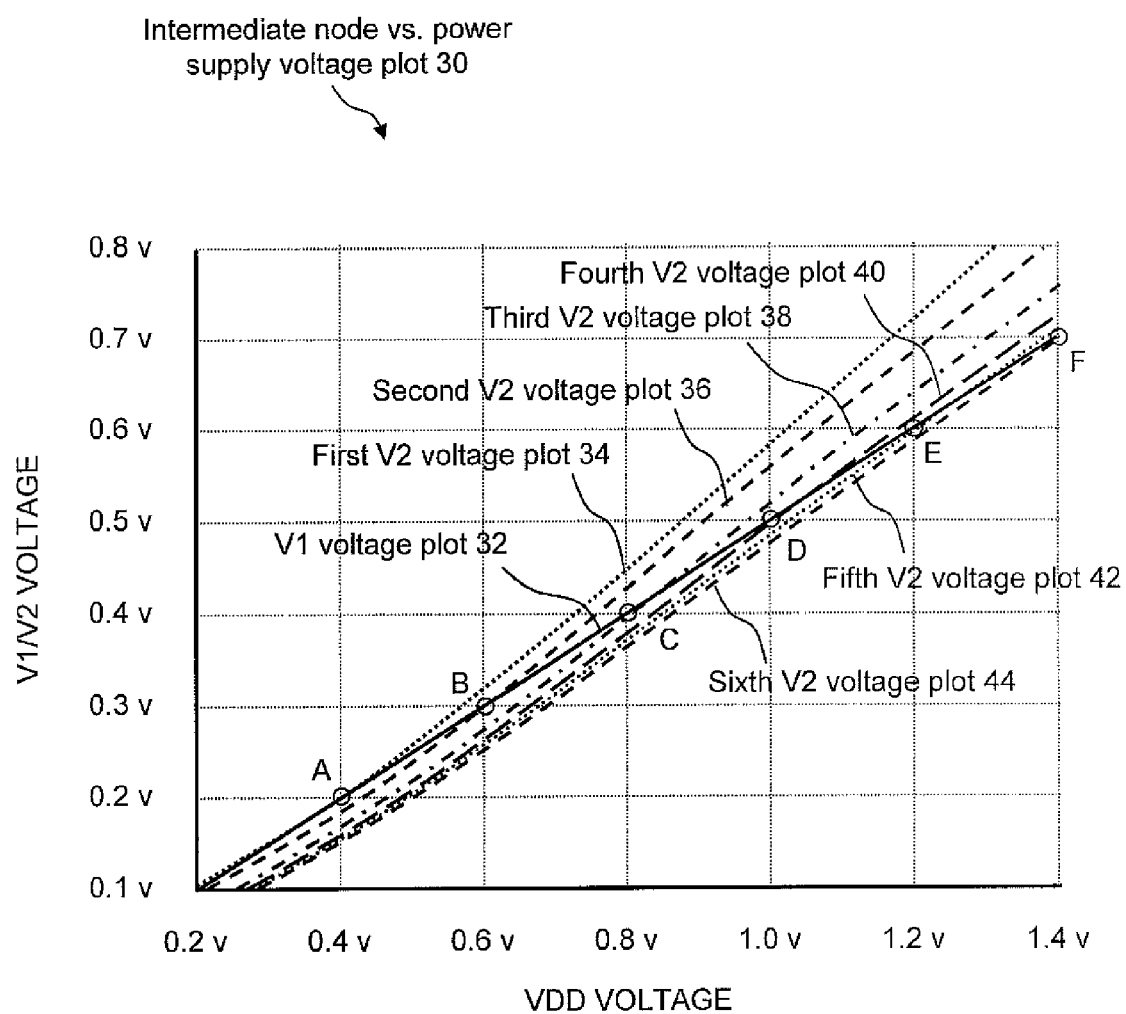
FIG. 3 illustrates an exemplary intermediate node vs. power supply voltage plot for various device ratios within a second of two tunneling device stacks of the tunneling device voltage detection circuit of FIG. 2.

FIG. 3 illustrates an exemplary intermediate node vs. power supply voltage plot 30, which illustrates various N3/N4 device ratios and resulting crossover points on the profiles of first and second voltages of TD voltage detection circuit 14 of FIG. 2. In particular and referring again to FIG. 2, when supply voltage VDD is ramping up, intermediate node vs. reference node voltage plot 30 shows multiple examples of how there is only one nonzero point at which first voltage V1, which has a linear relationship to supply voltage VDD, and second voltage V2, which has a nonlinear relationship to supply voltage VDD, are equal. This crossover point is a function of the N3/N4 device ratio of second device stack 18. The x-axis of intermediate node vs. reference node voltage plot 30 indicates supply voltage VDD voltage and the y-axis indicates first and second voltages V1, V2.

Intermediate node vs. reference node voltage plot 30 shows a plot of a V1 voltage ramp 32, which in every scenario is substantially equal to one-half of supply voltage VDD because it has a linear relationship to supply voltage VDD and transistors N1, N2 in this example have identical voltages drops. In a first example, intermediate node vs. reference node voltage plot 30 shows a plot of a first V2 voltage ramp 34 that intersects with V1 voltage ramp 32 at a point A, at which first and second voltages V1, V2 each equal 200 mV, which is the result of an N3/N4 device ratio of 11.92. More details of the circuit conditions that generate first V2 voltage ramp 34 are shown in Example No. 1 of Table 1 below.

In a second example, intermediate node vs. reference node voltage plot 30 shows a plot of a second V2 voltage ramp 36 that intersects with V1 voltage ramp 32 at a point B only, at which first and second voltages V1, V2 each equal 300 mV, which is the result of an N3/N4 device ratio of 7.09. More details of the circuit conditions that generate second V2 voltage ramp 36 are shown in Example No. 2 of Table 1 below.

In a third example, intermediate node vs. reference node voltage plot 30 shows a plot of a third V2 voltage ramp 38 that intersects with V1 voltage ramp 32 at a point C only, at which first and second voltages V1, V2 each equal 400 mV, which is the result of an N3/N4 device ratio of 3.64. More details of the circuit conditions that generate third V2 voltage ramp 38 are shown in Example No. 3 of Table 1 below.

In a fourth example, intermediate node vs. reference node voltage plot 30 shows a plot of a fourth V2 voltage ramp 40 that intersects with V1 voltage ramp 32 at a point D only, at which first and second voltages V1, V2 each equal 500 mV, which is the result of an N3/N4 device ratio of 2.52. More details of the circuit conditions that generate fourth V2 voltage ramp 40 are shown in Example No. 4 of Table 1 below.

In a fifth example, intermediate node vs. reference node voltage plot 30 shows a plot of a fifth V2 voltage ramp 42 that intersects with V1 voltage ramp 32 at a point E only, at which first and second voltages V1, V2 each equal 600 mV, which is the result of an N3/N4 device ratio of 2.09. More details of the circuit conditions that generate fifth V2 voltage ramp 42 are shown in Example No. 5 of Table 1 below.

In a sixth example, intermediate node vs. reference node voltage plot 30 shows a plot of a sixth V2 voltage ramp 44 that intersects with V1 voltage ramp 32 at a point F only, at which first and second voltages V1, V2 each equal 700 mV, which is the result of an N3/N4 device ratio of 1.85. More details of the circuit conditions that generate sixth V2 voltage ramp 44 are shown in Example No. 6 of Table 1 below.

TABLE 1

Example circuit conditions and resulting voltages V1 and V2

| Example No. | VDD voltage (mV) | Oxide thickness (nm) | N1&N2 W/L (microns) | N3 W/L (microns) | N4 W/L (microns) | N3/N4 device ratio | V1 = V2 voltage (mV) |
|---|---|---|---|---|---|---|---|
| 1 | 400 | 1.40 | 5.0/10.0 | 130/10 | 10.9/10 | 11.92 | 200 |
| 2 | 600 | 1.40 | 5.0/10.0 | 130/10 | 18.33/10 | 7.09 | 300 |
| 3 | 800 | 1.40 | 5.0/10.0 | 130/10 | 35.71/10 | 3.64 | 400 |
| 4 | 1000 | 1.40 | 5.0/10.0 | 130/10 | 51.58/10 | 2.52 | 500 |
| 5 | 1200 | 1.40 | 5.0/10.0 | 130/10 | 62.2/10 | 2.09 | 600 |
| 6 | 1400 | 1.40 | 5.0/10.0 | 130/10 | 70.27/10 | 1.85 | 700 |

Note:
In all examples, N1, N2, & N3 are normal-Vt devices and N4 is low-Vt device.

Intermediate node vs. reference node voltage plot 30 of FIG. 3 and Table 1 illustrate how modifying, for example, the N3/N4 device ratio of second device stack 18 allows the point at which first voltage V1 equals second voltage V2 (i.e., the crossover point) to change. In doing so, the trigger point for trigger signal TRIGGER FLAG of TD voltage detection circuit 14 may be adjusted for a given application.

Figure 4:
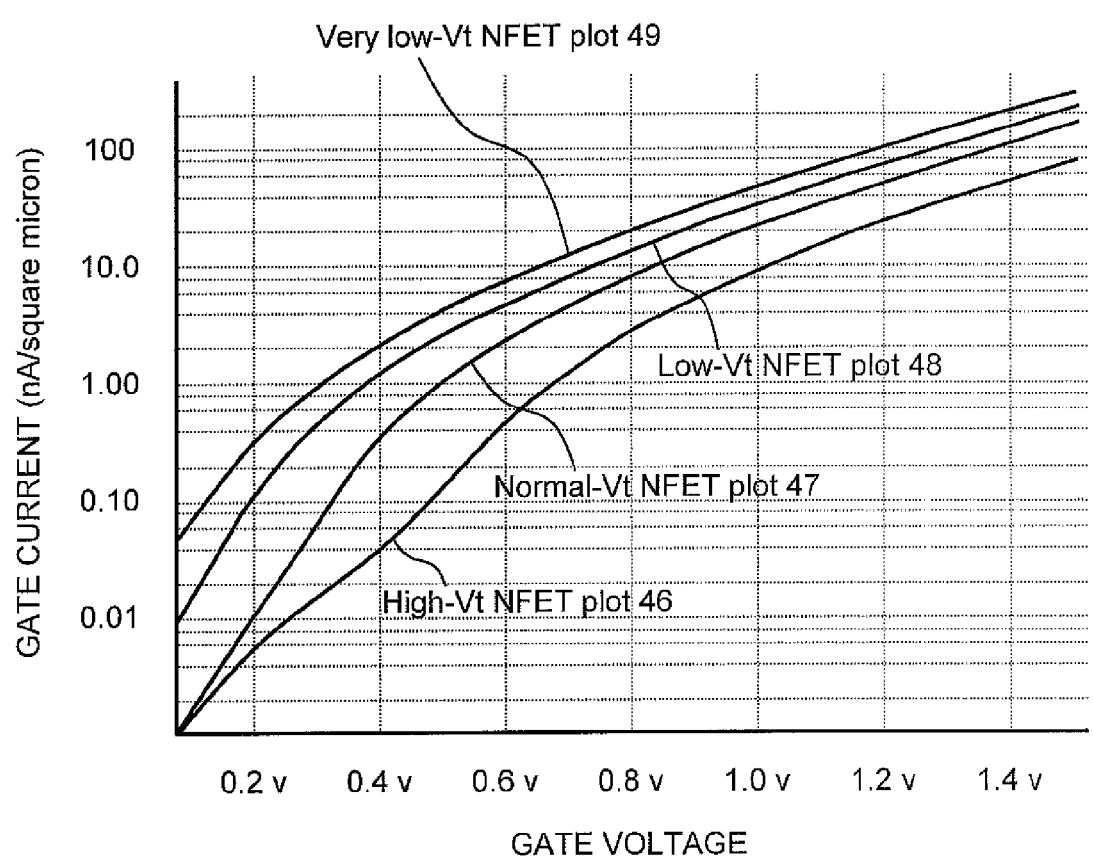
FIG. 4 is a graph showing the relative tunneling current of high-Vt, normal-Vt, low-Vt and very low-Vt devices as a function of gate voltage.

It is demonstrated in Table 1 that as N3/N4 device ratio is decreased, the intermediate second voltage V2 becomes larger. This can be explained by the difference in tunneling current of a normal-Vt device versus that of a low-Vt device at a given gate voltage. A gate current vs. gate voltage plot 45 of FIG. 4 shows gate tunneling current as a function of gate voltage for high-Vt (i.e., high-Vt nFET plot 46), normal-Vt (i.e., normal-Vt nFET plot 47), low-Vt (i.e., low-Vt nFET plot 48), and very low-Vt (i.e., very low-Vt nFET plot 49) devices. For a given gate voltage, the current per square micrometer of gate-oxide area increases as the Vt of the device decreases. It can also be seen that as gate voltage is increased, this difference between the low-Vt device current and the normal-Vt device current reduces.

The voltage detection circuit of FIGS. 1 and 2 outputs a flag at a VDD voltage which is essentially 2× the voltage where first voltage V1 equals second voltage V2, and because first voltage V1 is essentially one-half of voltage VDD, and the current through device N3 equals the current through device N4, it follows that the voltage across device N3 must equal the voltage across device N4, which equals second voltage V2. Hence the gate to source/drain voltages on devices N3, N4 are equal so their relative current densities can be found by inspection of the normal-Vt curve, and the low-Vt curve found respectively in FIG. 4. The current density of the low-Vt device (N4), is higher than that of the normal-Vt device (N3), so it follows that device N4 requires a smaller relative device area for equal tunneling current at equal gate to source/drain voltages. At higher gate voltages, the difference between the low-Vt device current and the normal-Vt device current is reduced so the area of low-Vt device N4 must be increased over its value at lower gate voltages. The device ratio of N3/N4 can be adjusted higher or lower from the current density curves of FIG. 4 to chose a trigger voltage at a desired VDD.

Referring again to FIG. 2, example W/L ratios of the transistors of TD voltage detection circuit 14 that support the W/L values of N1, N2, N3, and N4 shown in Table 1 are as follows: P1=3.0/1.0, P2=3.0/1.0, N5=1.0/1.0, and N6=1.0/1.0.

Figure 5:
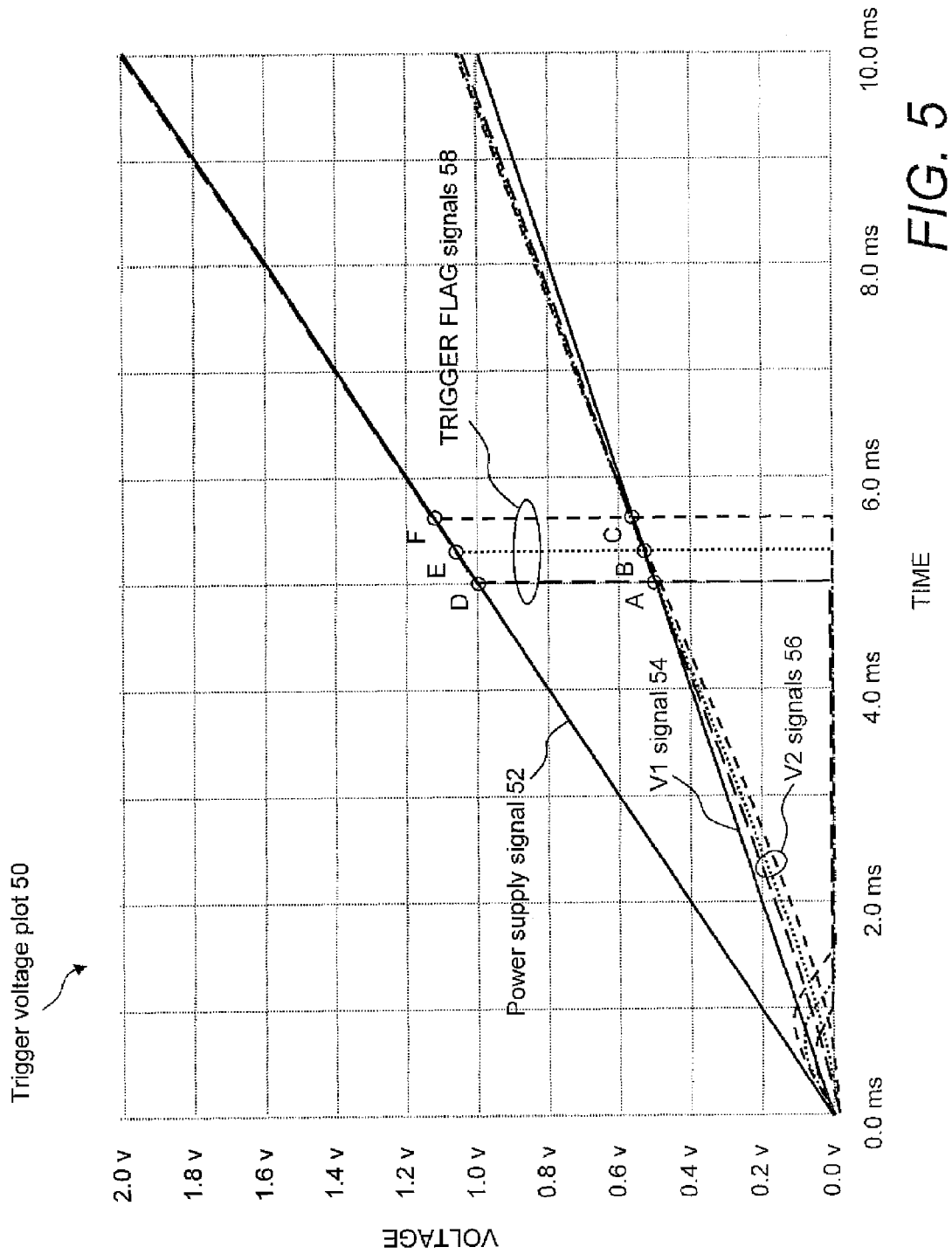
FIG. 5 illustrates an exemplary trigger voltage plot of the tunneling device voltage detection circuit of FIGS. 1 and 2.

FIG. 5 illustrates an exemplary trigger voltage plot 50 illustrating the performance of TD voltage detection circuit 14 of FIGS. 1 and 2. In particular, trigger voltage plot 50 of FIG. 5 shows first and second voltages V1, V2 ramping up with the power supply voltage (e.g., voltage VDD) and generating a trigger voltage. More specifically, trigger voltage plot 50 shows a power supply signal 52 that is ramping from 0 to 2.0 volts, a V1 signal 54 that is ramping linearly from 0 to 1.0 volts at a rate of about power supply signal 52 divided by two, a set of V2 signals 56 (i.e., best case, nominal, and worst case signals) that are ramping nonlinearly from 0 volts to respective crossover points A (best case), B (nominal), and C (worst case) at which first voltage V1 equals second voltage V2, and a set of trigger signals 58 (i.e., best case, nominal, and worst case signals) that transition from a logic zero to a logic one at points D (best case), E (nominal), and F (worst case) along power supply signal 52 that correlate to points A, B, and C, respectively. In this example, the desired power supply trigger point is where power supply signal 52 equals 1 volt, the W/L of N3 is 130/10, and the W/L of N4 is 51.58/10, the resulting N3/N4 device ratio is (130×10)/(51.58×10)=2.52, such that the crossover point of first and second voltages V1, V2 is approximately the desired power supply trigger point divided by two, or 0.5 volts, which results in power supply signal 52 voltage values of point D=0.996 v, E=1.070 v, and F=1.131 v. In this example, the predictability of the transition of trigger signals 58 falls in a narrow range of about 135 mV of power supply signal 52.

An exemplary embodiment has been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An integrated circuit chip, comprising:
   a power supply network for supplying a supply voltage to functional circuitry; and
   a trigger circuit that includes:
      a first voltage divider stack comprising:
         a first input in electrical communication with said power supply network; and
         a first internal node for providing a first divided output voltage;
      a second voltage divider stack electrically coupled to said power supply network in parallel with said first voltage divider stack, said second voltage divider stack comprising:
         a second input in electrical communication with said power supply network; and
         a second internal node for providing a second divided output voltage wherein:

said second voltage divider stack is configured so that said second divided output voltage has a nonlinear relationship to said supply voltage;

said second voltage divider stack comprises a first capacitor and a second capacitor coupled in series with one another so as to define said second internal node;

said first capacitor has a first leakage current and coin rises a first transistor having a first gate oxide and said first leakage current is provided by current tunneling across said first gate oxide;

said second capacitor has a second leakage current and coin rises a second transistor having a second gate oxide and said second leakage current is provided by current tunneling across said second gate oxide; and said first transistor is a low-voltage-threshold device and said second transistor is a regular-voltage-threshold device; and output circuitry in electrical communication with said first internal node and said second internal node and operatively configured to generate a digital trigger flag as a function of said first divided output voltage and said second divided output voltage.

2. The integrated circuit chip of claim 1, wherein said first gate oxide has a first area and said second gate oxide has a second area different from said first area.

3. The integrated circuit chip of claim 1, wherein said first voltage divider stack comprises a third capacitor and a fourth capacitor coupled in series with one another so as to define said first internal node.

4. The integrated circuit chip of claim 3, wherein:

said third capacitor has a third leakage current and comprises a third transistor having a third gate oxide and said third leakage current is provided by current tunneling across said third gate oxide; and said fourth capacitor has a fourth leakage current and comprises a fourth transistor having a fourth gate oxide and said fourth leakage current is provided by current tunneling across said fourth gate oxide.

5. The integrated circuit chip of claim 1, wherein said output circuitry comprises a differential amplifier and an output stage device responsive to an output stage control voltage, said differential amplifier for receiving and operating on said first divided output and said second divided output so as to output said output stage control voltage.

6. The integrated circuit chip of claim 5, wherein said output circuitry is operatively configured to initiate output of said digital trigger flag when said second divided output voltage is substantially equal to said first divided output voltage.

7. The integrated circuit chip of claim 1, wherein said output circuitry comprises a differential amplifier and an output stage device responsive to an output stage control voltage, said differential amplifier for receiving and operating on said first divided output and said second divided output so as to output said output stage control voltage.

8. The integrated circuit chip of claim 7, wherein said output circuitry is operatively configured to initiate output of said digital trigger flag when said second divided output voltage is substantially equal to said first divided output voltage.

9. The integrated circuit chip of claim 1, wherein said first divided output voltage is substantially equal to one-half of said supply voltage.

10. An integrated circuit, comprising:

a power supply network for supplying a supply voltage to functional circuitry; and a trigger circuit that includes:

a first voltage divider stack comprising:

a first input in electrical communication with said power supply network; and a first internal node for providing a first divided output voltage;

a second voltage divider stack electrically coupled to said power supply network in parallel with said first voltage divider stack and comprising:

a first capacitor that includes a second input in electrical communication with said power supply network; and a second capacitor electrically connected in series with said first capacitor so as to define a second internal node for providing a second divided output voltage;

wherein:

said first capacitor has a first leakage current and comprises a first transistor having a first gate oxide and said first leakage current is provided by current tunneling across said first gate oxide;

said second capacitor has a second leakage current and comprises a second transistor having a second gate oxide and said second leakage current is provided by current tunneling across said second gate oxide; and said first transistor is a low-voltage-threshold device and said second transistor is a regular-voltage-threshold device; and output circuitry in electrical communication with said first internal node and said second internal node and operatively configured to generate a digital trigger flag as a function of said first divided output voltage and said second divided output voltage.

11. The integrated circuit of claim 10, wherein said first gate oxide has a first area and said second gate oxide has a second area different from said first area.

12. The integrated circuit of claim 10, wherein said first voltage divider stack comprises a third capacitor and a fourth capacitor coupled in series with one another so as to define said first internal node.

13. The integrated circuit of claim 12, wherein:

said third capacitor has a third leakage current and comprises a third transistor having a third gate oxide and said third leakage current is provided by current tunneling across said third gate oxide; and said fourth capacitor has a fourth leakage current and comprises a fourth transistor having a fourth gate oxide and said fourth leakage current is provided by current tunneling across said fourth gate oxide.

14. The integrated circuit of claim 10, wherein said output circuitry comprises a differential amplifier and an output stage device responsive to an output stage control voltage, said differential amplifier for receiving and operating on said first divided output and said second divided output so as to output said output stage control voltage.

15. The integrated circuit of claim 14, wherein said output circuitry is operatively configured to initiate output of said digital trigger flag when said second divided output voltage is substantially equal to said first divided output voltage.

16. The integrated circuit of claim 10, wherein said output circuitry comprises a differential amplifier and an output stage device responsive to an output stage control voltage, said differential amplifier for receiving and operating on said first divided output and said second divided output so as to output said output stage control voltage.

17. The integrated circuit of claim 16, wherein said output circuitry is operatively configured to initiate output of said digital trigger flag when said second divided output voltage is substantially equal to said first divided output voltage.

18. The integrated circuit of claim 10, wherein said first divided output voltage is substantially equal to one-half of said supply voltage.

19. An integrated circuit, comprising:
   a voltage trigger circuit that includes:
      a first voltage divider stack for providing a first divided voltage and comprising:
         a first field effect transistor having a first gate oxide layer; and
         a second field effect transistor having a second gate oxide layer;
         wherein said first field effect transistor and said second field effect transistor are electrically coupled in series so as to define a first internal node and provide a first current path that includes current tunneling through said first gate oxide layer and said second gate oxide layer; and
      a second voltage divider stack for providing a second divided voltage, said second voltage divider electrically connected in parallel with said first voltage divider and comprising:
         a third field effect transistor having a third gate oxide layer; and
         a fourth field effect transistor having a fourth gate oxide layer;
         wherein said third field effect transistor and said fourth field effect transistor are electrically coupled in series so as to define a second internal node and provide a second current path that includes current tunneling through said third gate oxide layer and said fourth gate oxide layer; and
         wherein said third field effect transistor has a low threshold voltage and said fourth field effect transistor has a regular threshold voltage.

20. The integrated circuit of claim 19, further comprising a differential amplifier operatively connected to each of said first internal node and said second internal node so as to compare said first divided voltage and said second divided voltage with one another and output an output stage control signal.

* * * * *